(12) United States Patent
Ker et al.

(10) Patent No.: US 6,903,913 B2
(45) Date of Patent: Jun. 7, 2005

(54) ESD PROTECTION CIRCUIT FOR MIXED-VOLTAGE I/O PORTS USING SUBSTRATED TRIGGERING

(75) Inventors: Ming-Dou Ker, Hsinchu (TW); Chien-Hui Chuan, Taipei Hsien (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 309 days.

(21) Appl. No.: 10/253,643

(22) Filed: Sep. 25, 2002

(65) Prior Publication Data
US 2003/0076645 A1 Apr. 24, 2003

(30) Foreign Application Priority Data
Oct. 19, 2001 (TW) ........................................ 90125932 A

(51) Int. Cl.⁷ ................................................. H02H 3/22
(52) U.S. Cl. .......................................... 361/111; 361/56
(58) Field of Search ............................ 361/56, 111, 117, 361/115; 257/328, 355

(56) References Cited

U.S. PATENT DOCUMENTS

| | | | | |
|---|---|---|---|---|
| 5,932,918 A | * | 8/1999 | Krakauer | 257/368 |
| 5,946,177 A | * | 8/1999 | Miller et al. | 361/56 |
| 6,140,682 A | * | 10/2000 | Liu et al. | 257/355 |
| 6,327,126 B1 | * | 12/2001 | Miller et al. | 361/56 |
| 6,657,835 B2 | * | 12/2003 | Ker et al. | 361/56 |

* cited by examiner

Primary Examiner—Brian Sircus
Assistant Examiner—Boris Benenson
(74) Attorney, Agent, or Firm—Birch, Stewart, Kolasch & Birch, LLP

(57) ABSTRACT

An ESD protection circuit for mixed-voltage input/output (I/O) circuits. The ESD protection circuit utilizes substrate triggering of a parasitic NPN BJT under a cascaded NMOS transistor pair with a current generated by a triggering current generator. The ESD protection circuit is triggered much faster. Under normal circuit operations, the triggering current generator can also endure high-voltage signals without overstressing internal components and retains good reliability.

5 Claims, 15 Drawing Sheets

ESD PROTECTION CIRCUIT FOR MIXED-VOLTAGE I/O PORTS USING SUBSTRATED TRIGGERING

BACKGROUND OF THE INVENTION

1. Field of the Invention

The present invention relates in general to an ESD protection circuit for mixed-voltage input/output (I/O) circuits. In particular, the present invention relates to an ESD protection circuit using substrate triggering.

2. Description of the Related Art

As the capacity and the processing speed of integrated circuits (ICs) has increase, metal-oxide-semiconductor (MOS) transistors on semiconductor chips have become smaller. Most ICs manufactured in the advanced semiconductor processes require low power supplies and output low-voltage signals. Compatibility of ICs is considered an important issue in an integrated system. ICs requiring low power supplies not only need to receive low-voltage signals from other ICs requiring low power supplies, but also high-voltage signals from ICs manufactured in the old semiconductor processes (requiring high power supplies). The high-voltage signals often cause problems in the reliability of MOS transistors designed for low-voltage signals. Therefore, I/O ports of the ICs of low power supplies are especially required to receive high-voltage signals without component damage. An I/O port capable of receiving high-voltage signals and the low-voltage signals is called a mixed-voltage I/O port.

FIG. 1 is a conventional circuit with a mixed-voltage I/O port. The conventional circuit comprises a pulling-down circuit 10 with two NMOS transistors, Na1 and Na2, stacked in series. The gate of the transistor Na1 is coupled to a power line VDD, and the gate of the transistor Na2 is coupled to internal circuits 11. If the voltage at the pad 14 is higher than the power line VDD, the maximum voltage at the point 12 is equal to the voltage of VDD-Vth, where Vth is the threshold voltage of Na1 device. The problem of device reliability caused by high voltages across the gate oxide layer of the transistor Na2 is solved.

When an ESD stress relatively positive to a power line VSS occurs at the pad 14, the ESD stress is released through the snap-back effect of a parasitic NPN bipolar junction transistor (BJT) under the stacked NMOS transistors Na1 and Na2. The parasitic NPN BJT is triggered by junction-breakdown current from the drain to the bulk of the transistor Na1. However, the junction-breakdown voltage between the drain and the bulk of the NMOS transistor is considerably high, resulting in low triggering speed and poor ESD protection.

SUMMARY OF THE INVENTION

An object of the present invention is to provide substrate triggering for the parasitic NPN BJT under stacked NMOS transistors in an ESD protection circuit.

Another object of the present invention is to enable the ESD protection circuit to sustain high-voltage signals without reliability issues.

In response to the object described above, the present invention provides an electrostatic discharge (EDS) protection circuit suitable for application to a mixed-voltage integrated circuit (IC). The ESD protection circuit comprises at least one cascoded transistor pair and a triggering current generator. Each cascoded transistor pair comprises a first N-type metal oxide semiconductor (NMOS) transistor and a second NMOS transistor. The first NMOS transistor is formed on a P-type semiconductor layer and has a gate region, a drain region and a source region; and the drain region is coupled to a pad of the mixed-voltage IC, and the gate region is coupled to a low power supply of the mixed-voltage IC. The second NNMOS transistor is formed on the P-type semiconductor layer, and has a gate region, a drain region, and a source region. The source region is coupled to a ground plane of the mixed-voltage IC. The source region of the first NMOS transistor is coupled to the drain region of the second NMOS transistor, and the drain region of the first NMOS transistor, the P-type semiconductor layer and the source region of the second NMOS transistor form the collector, the base and the emitter of a parasitic NPN bipolar junction transistor (BJT). The triggering current generator provides a triggering current to the base of the NPN BJT to trigger the NPN BJT and release the ESD current during an ESD event; and under normal power operations, the parasitic NPN is turned off by the triggering current generator.

The advantage of the present invention is the increased triggering speed of the ESD protection circuit. With the substrate triggering, the parasitic NPN BJT is turned on much faster to quickly release the ESD current and protect other components in the mixed-voltage IC.

Further scope of the applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings, which are given by way of illustration only, and thus are not limitative of the present invention, and wherein.

DETAILED DESCRIPTION OF THE INVENTION

Figure 1:
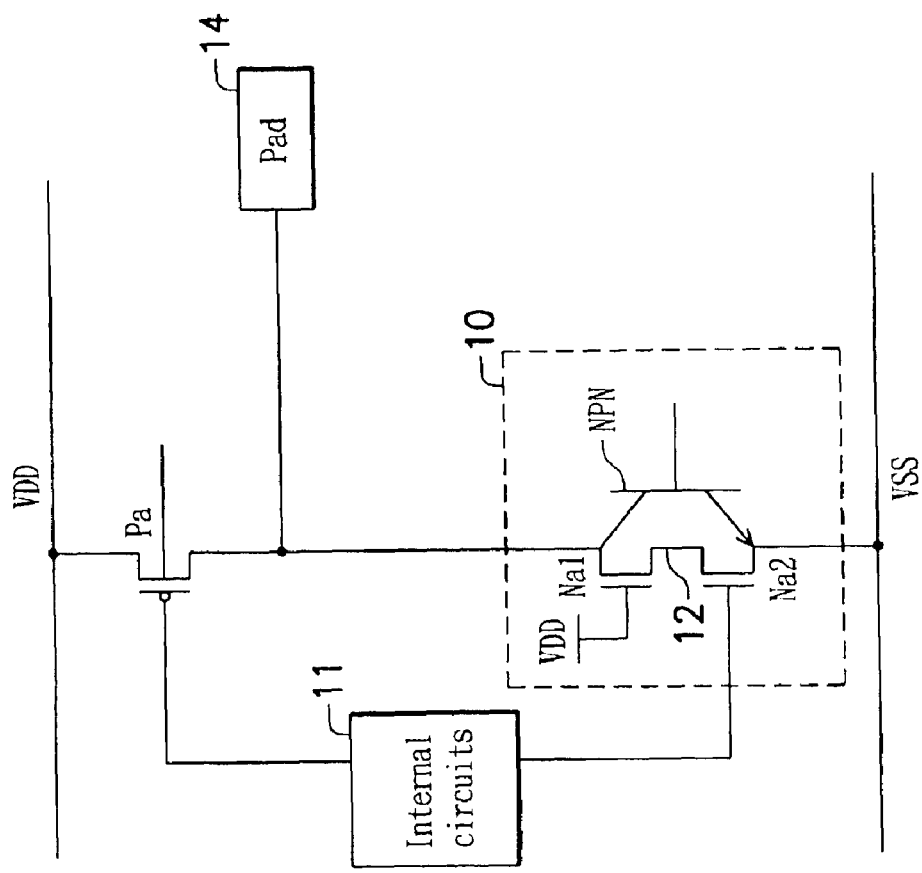
FIG. 1 is a conventional circuit with a mixed-voltage I/O port.
Figure 2:
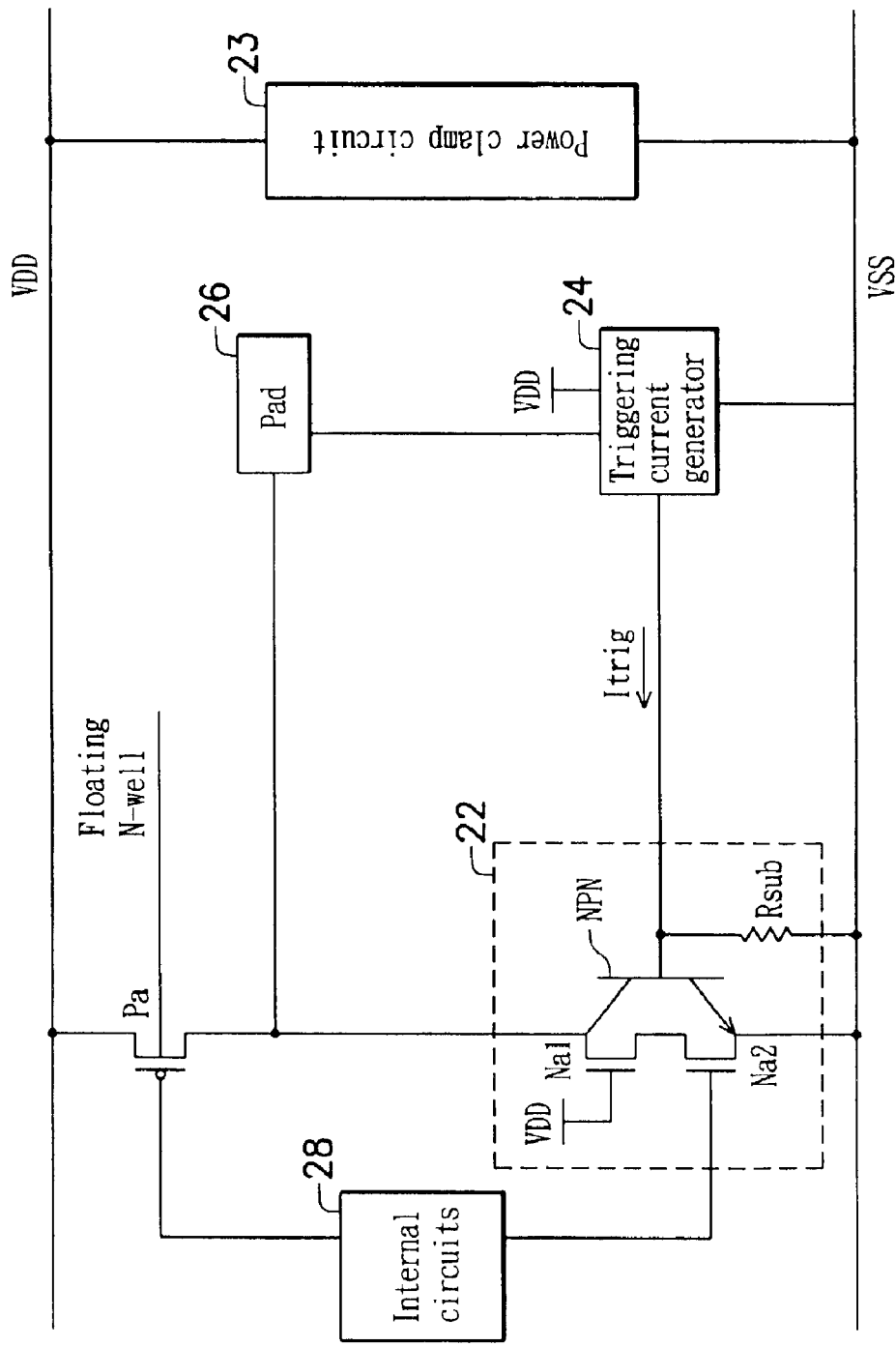
FIG. 2 is a schematic diagram of an ESD protection circuit of the present invention.

FIG. 2 is a schematic diagram of an ESD protection circuit of the present invention. The ESD protection circuit of the present invention is suitable for application to a mixed-voltage input port or a mixed-voltage input/output (I/O) port. The ESD protection circuit in FIG. 2 comprises at least one cascoded NMOS transistor pair 22. Each cascoded NMOS transistor pair 22 has an NMOS transistor Na1 and an NMOS transistor Na2 cascoded between a pad 26 and a ground plane VSS. The gate of the transistor Na1 is coupled to a power line VDD and the gate of the transistor Na2 is controlled by internal circuits 28. The drain of the NMOS transistor Na1 is coupled with the drain of a PMOS transistor Pa to the pad 26. The bulk of the PMOS transistor Pa is a floating N-well.

Figure 3:
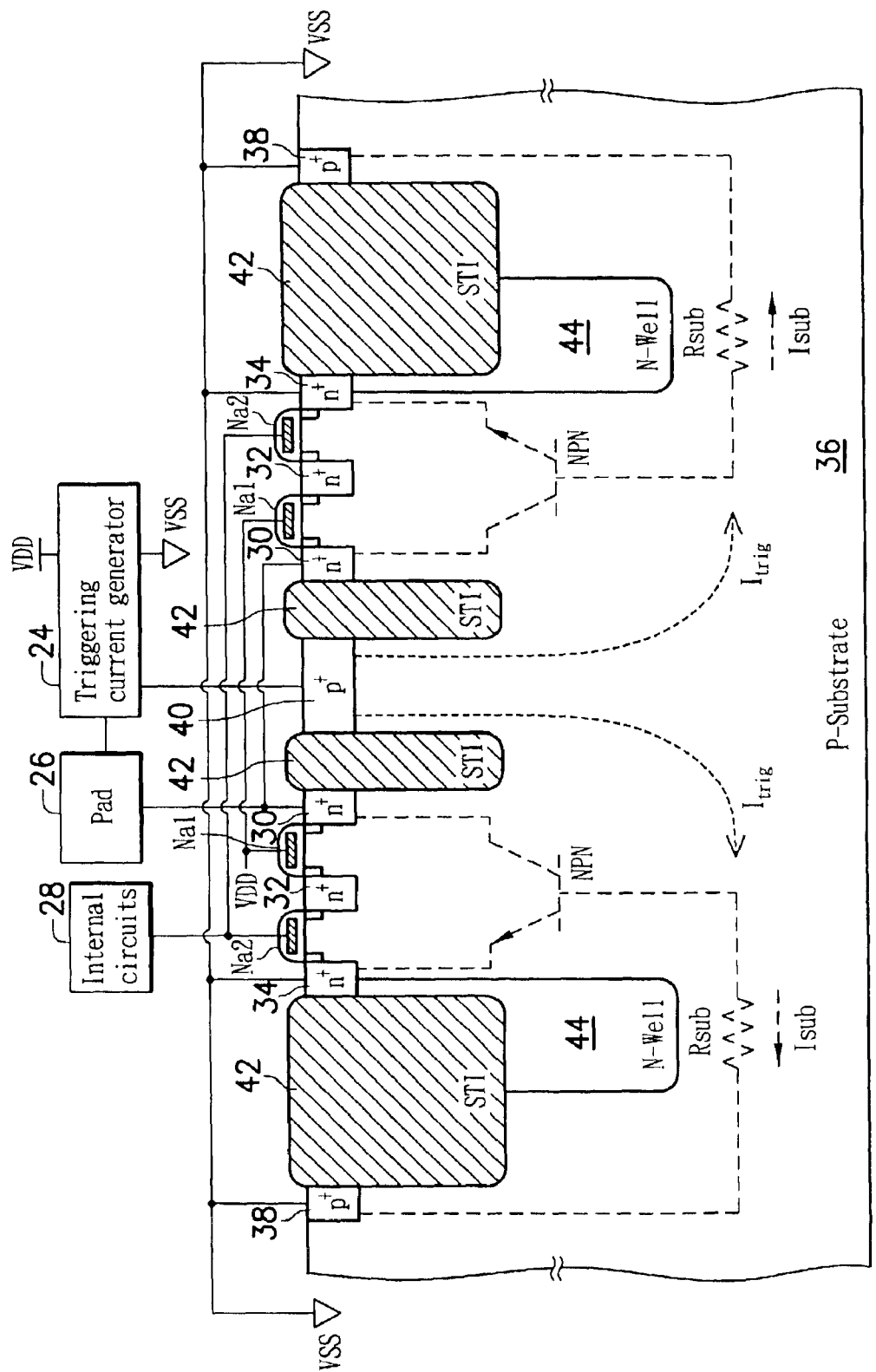
FIG. 3 is a cross-section of the cascoded NMOS transistor pair in FIG. 2.

FIG. 3 is a cross-section of the cascoded NMOS transistor pair in FIG. 2. The NMOS transistor Na1 in each transistor pair has an N+ doped region 30 as a drain coupled to the pad 26. The source of the NMOS transistor Na1 in each transistor pair is formed by an N+ doped region 32, also the drain of the transistors Na2. The source of the NMOS transistor Na2 in each transistor pair is formed by an N+ doped region 34. All the gates of the transistors Na1 are coupled to the power line VDD and all the gates of the transistors Na2 are coupled to the internal circuits 28. The transistors Na1 and Na2 are formed on a P-substrate 36. The P-substrate 36 is coupled to the ground plane VSS through P+ doped regions 38. Another P+ doped region 40 formed between the N+ doped regions 30 is the entry point of ESD triggering current. Shallow trench isolation (STI) regions 42 formed on the P-substrate 36 isolate the N+ doped regions 30 from the P+ doped region 40, and the N+ doped regions 34 from the P+ doped regions 38.

In FIG. 3, a parasitic NPN BJT is formed by the N+ doped region 30, the P-substrate 36 and the N+ doped region 34 under the transistors Na1 and Na2. The distance between the base of the NPN BJT (the P-substrate 36 under the transistors Na1 and Na2) and the actual ground point (P+ doped region 38) results in a spread resistance. A spread resistor $R_{sub}$ with the spread resistance is thus formed in the P-substrate 36 for each transistor pair. Alternatively, an N-well 44 may be formed under each of the N+ doped regions 34 and the STI regions 42 to increase the spread resistance.

As shown in FIG. 2, a power clamp circuit 23 is coupled between the power line VDD and the ground plane VSS. When an ESD event occurs between the power line VDD and the ground plane VSS, the power clamp circuit 23 is triggered to release the ESD current and the voltage across the power line VDD and the ground plane VSS is clamped.

The triggering current generator 24 in FIG. 2 (or FIG. 3) is used to detect an ESD event at the pad 26. When an ESD event occurs at the pad 26, the triggering current generator 24 provides a triggering current $I_{trig}$ to the P+ doped region 40. The electric potential at the base of the NPN BJT increases as the triggering current $I_{trig}$ flows toward the ground point (P+ doped region 38) of the P-substrate 36. The NPN BJT is therefore triggered to release the ESD stress as shown in FIG. 3. Under normal operations, no current is generated from the triggering current generator 24. The base of the NPN BJT is coupled to the ground plane VSS through the P+ doped region 38 and the NPN BJT is turned off.

Figure 4:
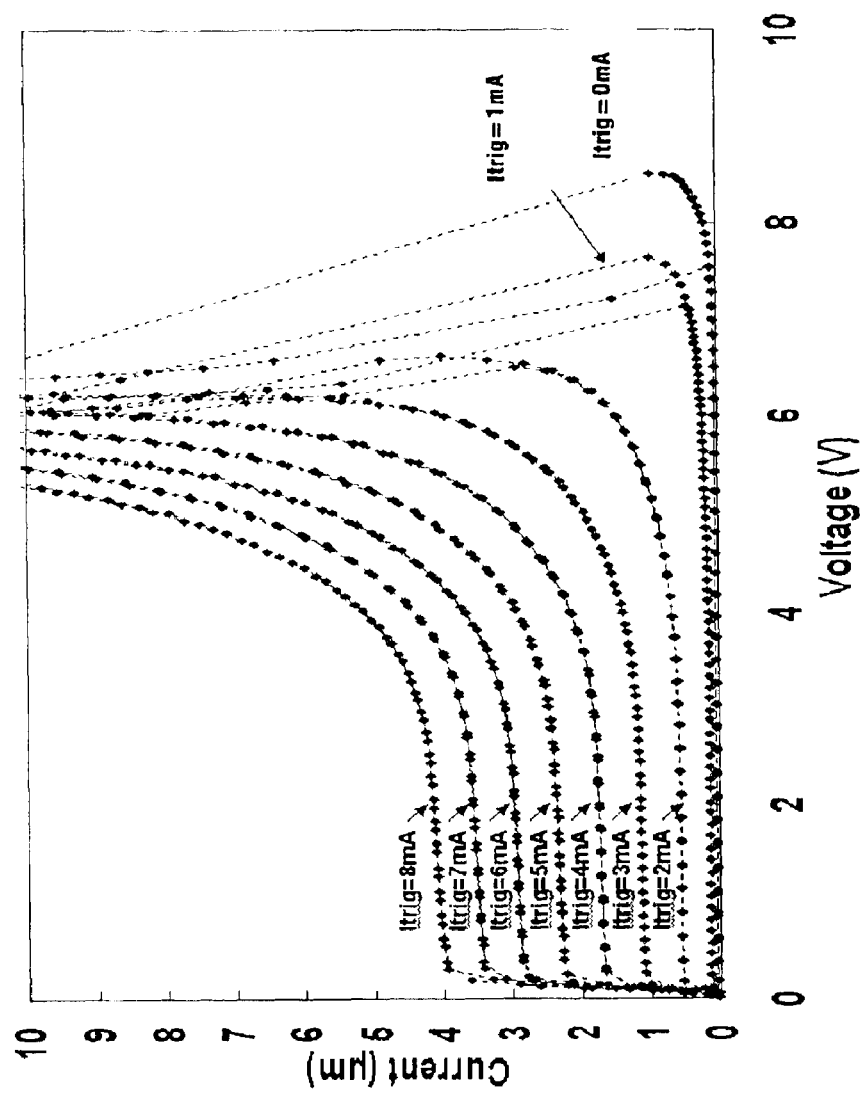
FIG. 4 is a voltage-current diagram of the parasitic NPN BJT under the stacked NMOS transistor pair of the ESD protection circuit of the present invention.

FIG. 4 is a voltage-current diagram of a parasitic NPN BJT under the stacked NMOS transistor pair of the ESD protection circuit of the present invention. The vertical axis shows the current at the collector and the horizontal axis shows the voltage $V_{CE}$ across the collector and the emitter. When the triggering current $I_{trig}$ is about 0, the triggering voltage of the NPN BJT is about 9 volts. As shown in FIG. 4, the triggering voltage $V_{CE}$ of the NPN BJT decreases as the triggering current $I_{trig}$ increases. The triggering voltage of the NPN BJT is decreased dramatically by inputting the triggering current $I_{trig}$ to the base of the NPN BJT during an ESD event. Such a technique implemented by inputting current to a substrate to lower triggering voltage is substrate triggering.

Figure 5:
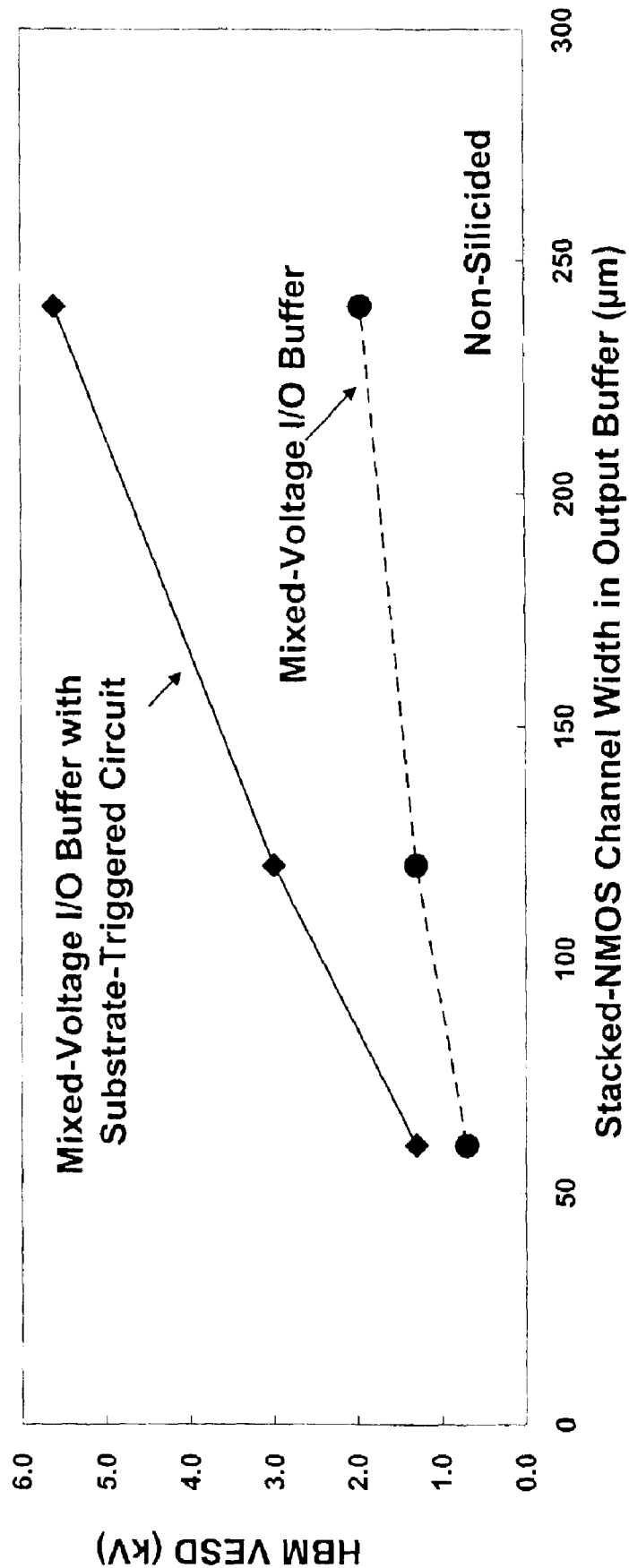
FIG. 5 shows the comparison of the efficiency of HBM ESD protection for stacked NMOS transistors manufactured in 0.25 µm CMOS process.

FIG. 5 shows the comparison of the efficiency of human-body-mode (HBM) ESD protection for stacked NMOS transistors manufactured in 0.25 $\mu$m complementary MOS (CMOS) process. As shown in the FIG. 5, the efficiency of HBM ESD protection for a stacked NMOS transistor, in general, increases with the size of the NMOS transistor. ESD protection efficiency for the stacked NMOS transistor not utilizing the substrate triggering increases to 2 KV when the channel width of the NMOS transistor reaches 250 $\mu$m. In comparison, the stacked NMOS transistor utilizing the substrate triggering tolerates twice the HBM ESD stress than that not utilizing the substrate triggering. In FIG. 5, at the channel width of 250 $\mu$m, the stacked NMOS transistor utilizing the substrate triggering has HBM ESD protection efficiency of 5.5 KV. The ESD protection efficiency of a stacked NMOS transistor is substantially increased by the substrate triggering.

Apart from providing a triggering current to the substrate during an ESD event, the triggering current generator 24 must endure the stress caused by the high-voltage signals and retain good reliability for the components under normal operations. No constant direct current is allowed in the triggering current generator 24 to limit power consumption under normal power operations. Six embodiments of the triggering-current generators are proposed in the present invention. However, the present invention is not to be limited by the proposed embodiments. The scope of the present invention should be interpreted in the broadest manner according to the claims of the present invention.

The First Embodiment

Figure 6:
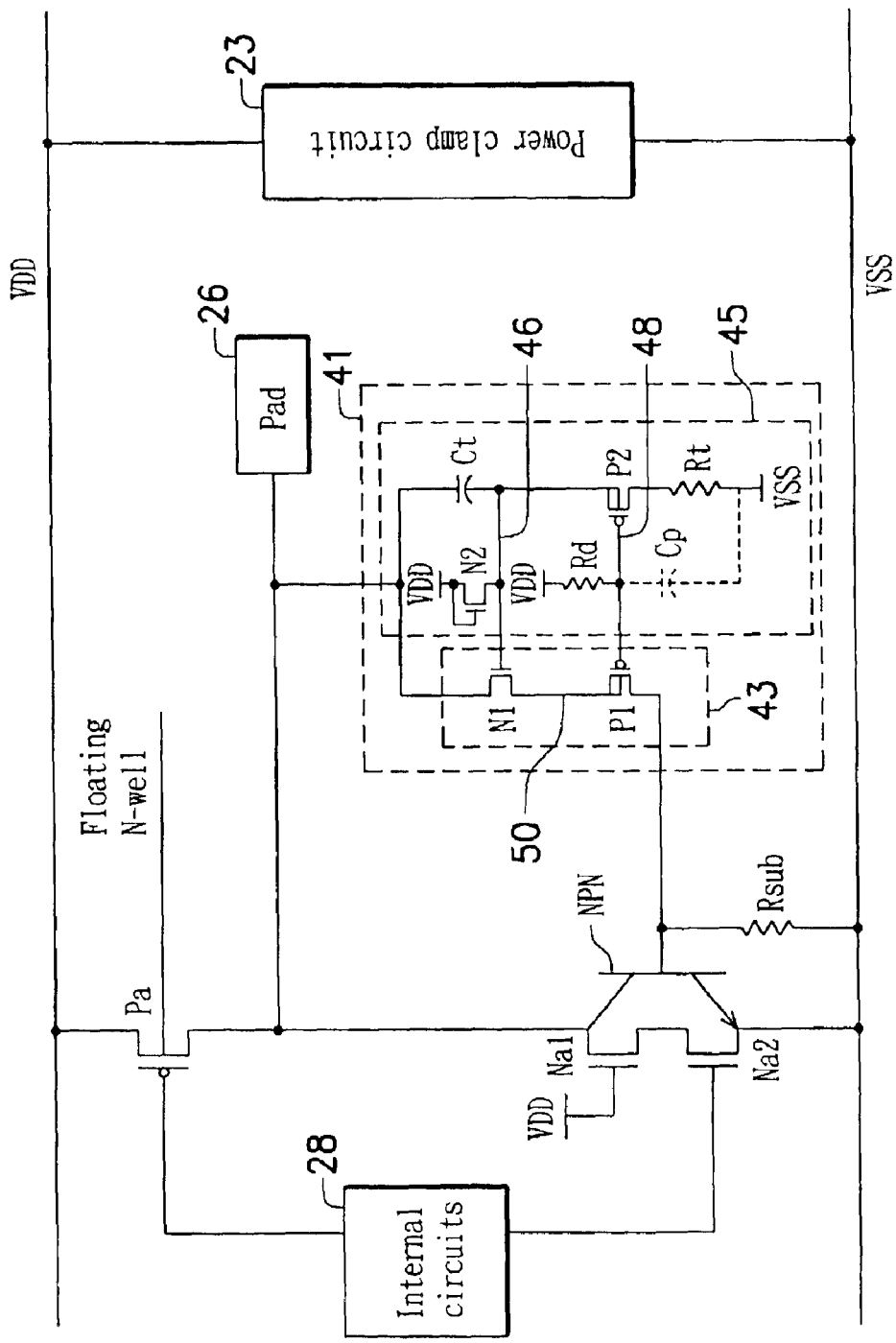
FIG. 6 is a schematic diagram of an ESD protection circuit using the substrate triggering.

FIG. 6 is a schematic diagram of an ESD protection circuit using the substrate triggering. The triggering current generator 41 coupled between a pad 26 and a power line VSS comprises a current generator 43 and an ESD detector 45. The current generator 43 is directly coupled to the pad 26 and is comprised of an NMOS transistor N1 and a PMOS transistor P1 connected in series. An NMOS transistor N2 connected to form an NMOS diode in the ESD detector 45 is coupled between a power line VDD and the gate of the NMOS transistor N1. The capacitor Ct is coupled between the pad 26 and the gate of the NMOS transistor N1. A resistor Rd is coupled between the power line VDD and the gate of the PMOS transistor P1. The gate of the PMOS transistor P2 is coupled to the gate of the PMOS transistor P1. The capacitor Ct, the PMOS transistor P2 and a resistor Rt are coupled in series.

The operations of the triggering current generator 41, during normal power operations and kinds of HBM ESD events, are illustrated as the followings.

Under Normal Circuit Operations

The voltage at the node 46 is clamped to about VDD-Vtn(the voltage of the power line VDD—the threshold voltage of N2). The node 48 is coupled to the power line VDD through the resistor Rd. When an input of a normal high-voltage signal occurs at the pad 26, the voltage at the node 50 does not exceed the voltage at the node 46 deducted by the threshold voltage of the NMOS transistors N1. All the voltages across the gates and the sources or drains for all the NMOS and PMOS transistors in the triggering current generator 41 are not higher than VDD (the voltage of the power line VDD). The triggering current generator 41 is formed with good reliability.

The voltage at the node 48 is approximately equal to VDD and the PMOS transistors (P1 and P2) are closed. No current is conducted from the pad 26 to the power line VSS through the triggering current generator 41. In other words, no direct current passes the triggering current generator 41 under normal circuit operations and power consumption is thus minimized.

PS-mode ESD Event

Figure 7:
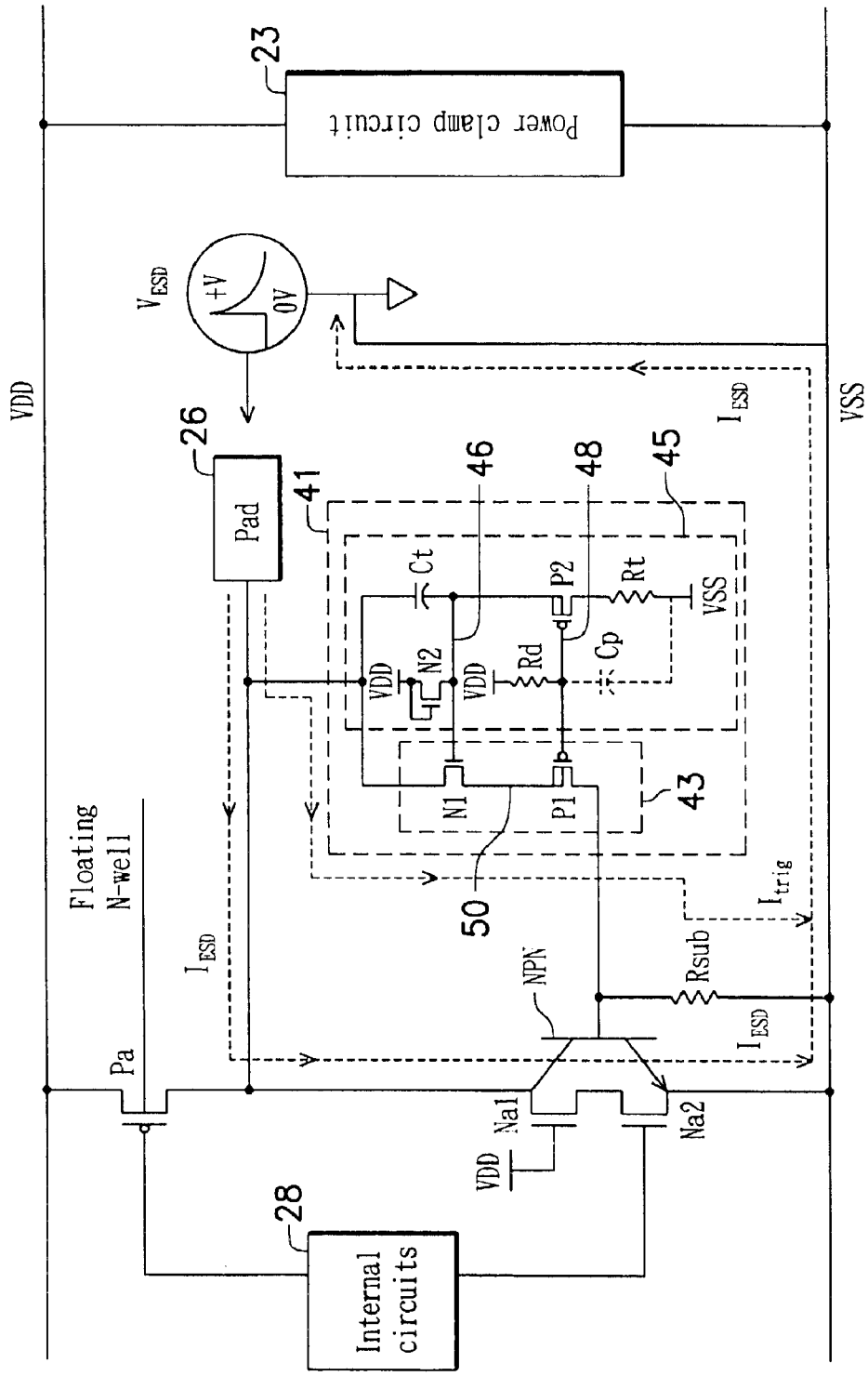
FIG. 7 shows the ESD current discharging path during a PS-mode ESD event.

In a PS-mode ESD event, the power line VSS is grounded while a positive ESD pulse occurs at the pad 26 as shown in FIG. 7.

Before an ESD event occurs, the whole IC is in a state of equivalent potential. All the nodes (including the power lines VDD, VSS, and the nodes 46 and 48) are coupled to the ground through the power line VSS. The NMOS transistor N1 is closed, while the PMOS transistors P1 and P2 are opened.

When a positive ESD pulse occurs at the pad 26, the voltage at the node 46 increases through the coupling effect of the capacitor Ct. The NMOS diode formed by the NMOS transistor N2 is reverse-biased and thus negligible. Namely, the ESD detector 45 is a RC coupling circuit formed by the capacitor Ct and the resistor Rt. The ESD stress turns on the NMOS transistor N1 through the coupling effect of the capacitor Ct. Small amount of triggering current $I_{trig}$ is sent from the pad 26 to the base of the NPN BJT through the turned-on transistors N1 and P1. When the voltage at the base of the NPN BJT (=$I_{trig} \times R_{sub}$) reaches a predetermined value, the NPN BJT is triggered to bypass the ESD current $I_{ESD}$ and release the ESD stress.

Figure 8:
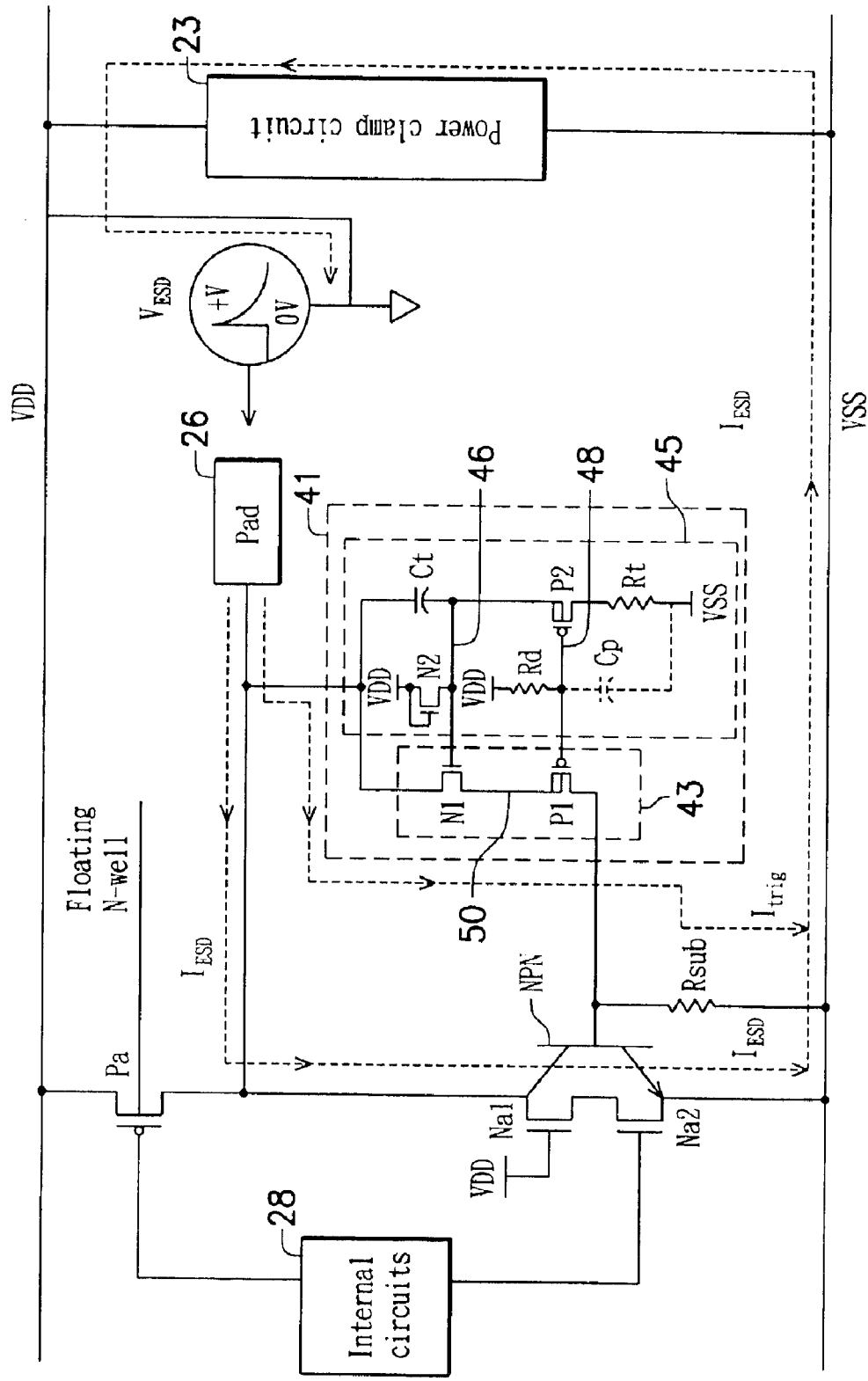
FIG. 8 shows the ESD current discharging path during a PD-mode ESD event.

PD-mode ESD Event p In a PD-mode ESD event, the power line VDD is grounded while a positive ESD pulse occurs at the pad 26 as shown in FIG. 8.

Before an ESD event, the whole IC is in an equivalent potential state. All the nodes (including power lines VDD, VSS, and the nodes 46 and 48) are coupled to the ground through the power line VDD. The NMOS transistor N1 is closed, while the PMOS transistors P1 and P2 are opened in the triggering current generator 41.

Similar to the PS-mode ESD event, the NPN BJT is triggered by the triggering current $I_{trig}$ to release the ESD current $I_{ESD}$ to the power line VSS, through the power clamp circuit 23 and the power line VDD to the ground, as shown in FIG. 8.

NS-mode ESD Event

Figure 9:
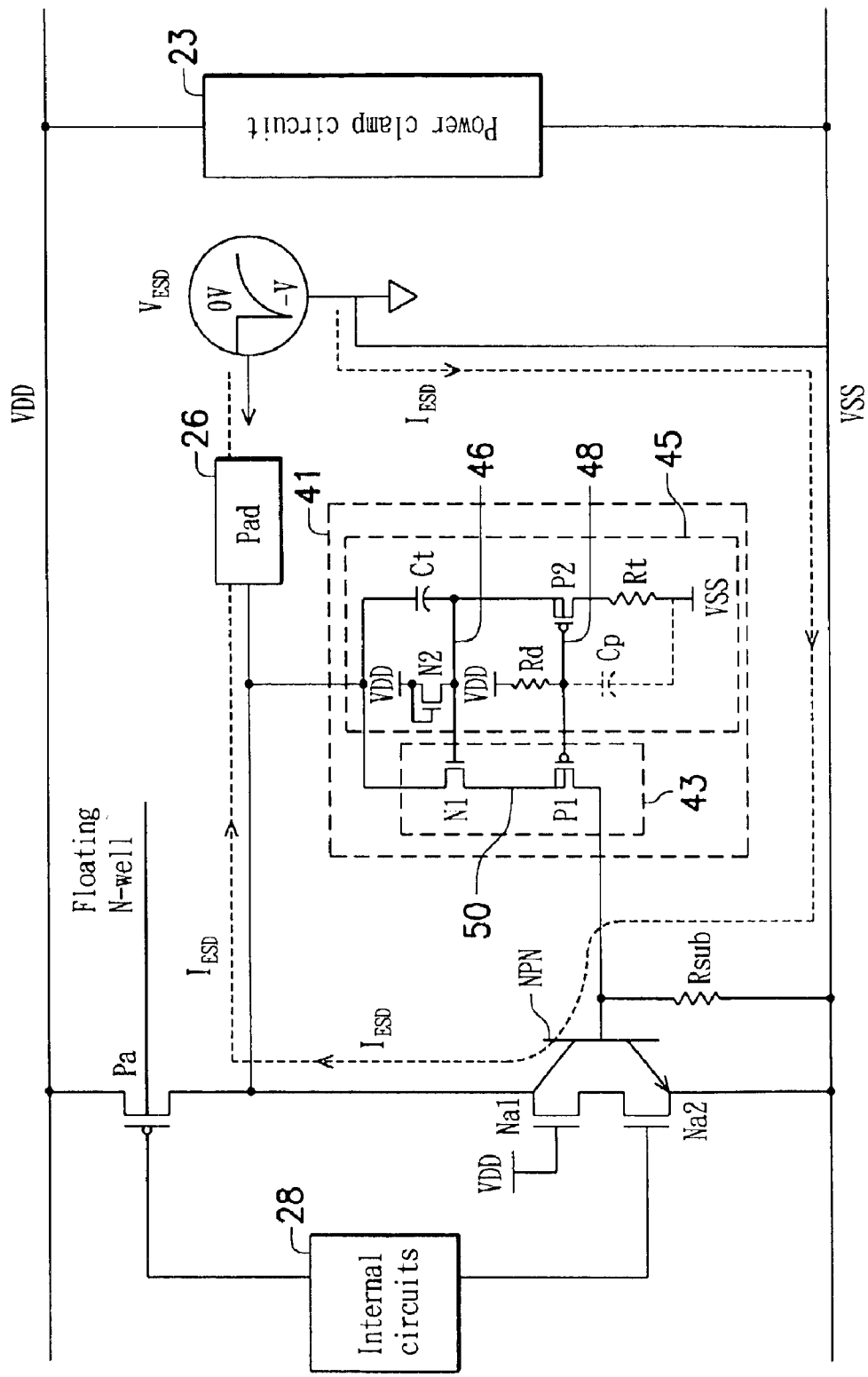
FIG. 9 shows the ESD current discharging path during a NS-mode ESD event.

In an NS-mode ESD event, the power line VSS is grounded while a negative ESD pulse occurs at the pad 26 as shown in FIG. 9.

The ESD current $I_{ESD}$ runs from the power line VSS, through the resistor $R_{sub}$, and the forward-biased junction between the base and the collector of the NPN BJT to the pad 26, as shown in FIG. 9.

ND-mode ESD Event

Figure 10:
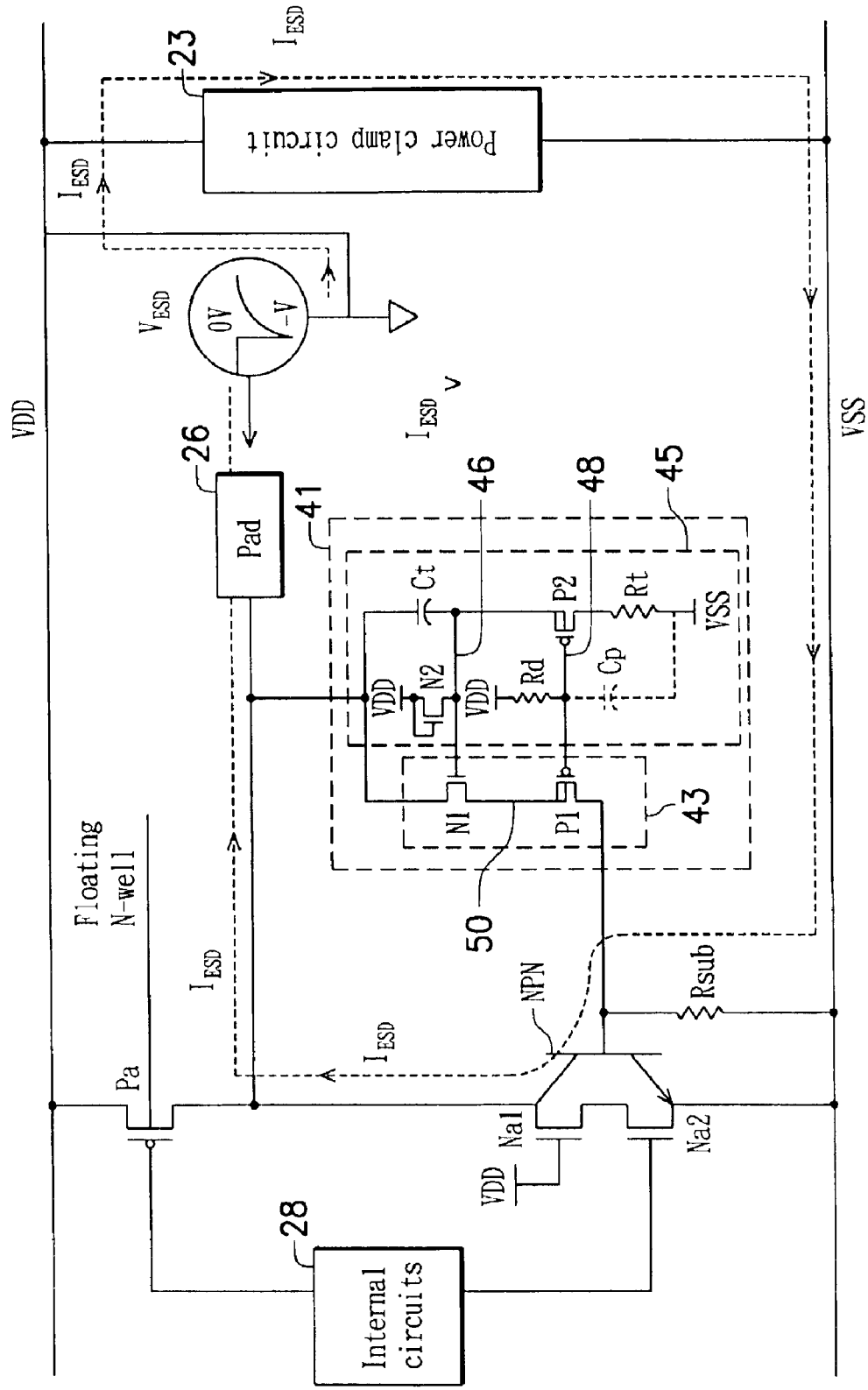
FIG. 10 shows the ESD current discharging path during a ND-mode ESD event.

In an ND-mode ESD event, the power line VDD is grounded while a negative ESD pulse occurs at the pad 26 as shown in FIG. 10.

Similar to the NS-mode ESD event, the ESD current $I_{ESD}$ flows fluently from the power line VSS to the pad 26. In the ND-mode ESD event, most of the ESD stress is distributed across the power lines VDD and VSS to trigger the power clamp circuit 23. The ESD current $I_{ESD}$ flows from the power line VDD, through the power clamp circuit 23, the power line VSS, the resistor $R_{sub}$, the forward-biased junction between the base and the collector of the NPN BJT to the pad 26, as shown in FIG. 10.

The Second Embodiment

Figure 11:
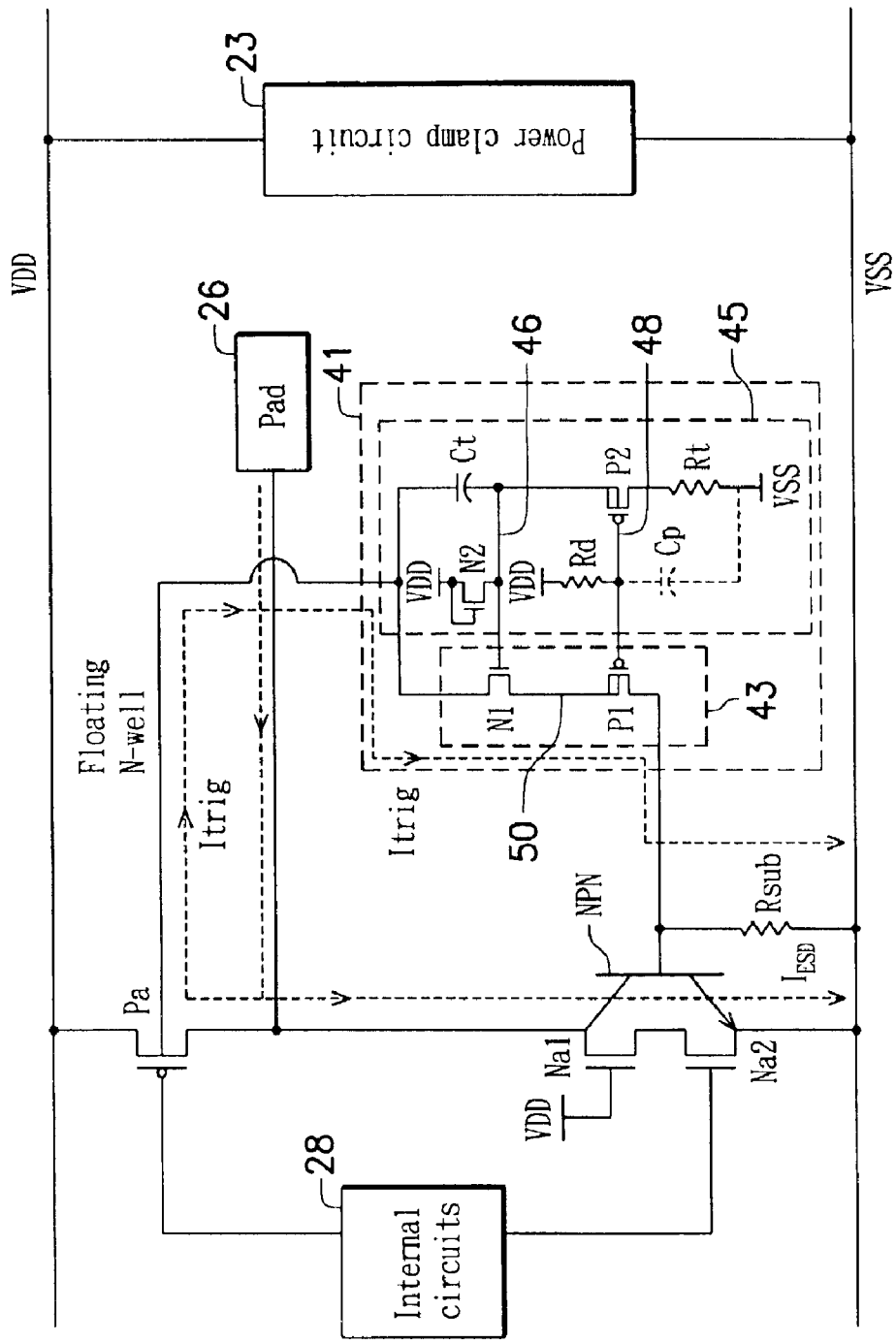
FIG. 11 to FIG. 15 show the schematic diagrams of the second to the sixth embodiments of the present invention.

FIG. 11 is a schematic diagram of the second embodiment of the present invention. The triggering current generator 41 coupled between a pad 26 and a power line VSS comprises a current generator 43 and an ESD detector 45. The input end of the current generator 43 (the drain of the NMOS transistor N1) and the detecting end of the ESD detector 45 (one end of the capacitor Ct) are coupled to the floating N-well of the PMOS transistor Pa. The paths of the triggering current $I_{trig}$ and the ESD current $I_{ESD}$ in a PS-mode ESD event are shown in FIG. 11. The operations of the ESD protection circuit in FIG. 11 during normal power operations and other modes of ESD events are similar to those in the first embodiment.

The Third Embodiment

Figure 12:
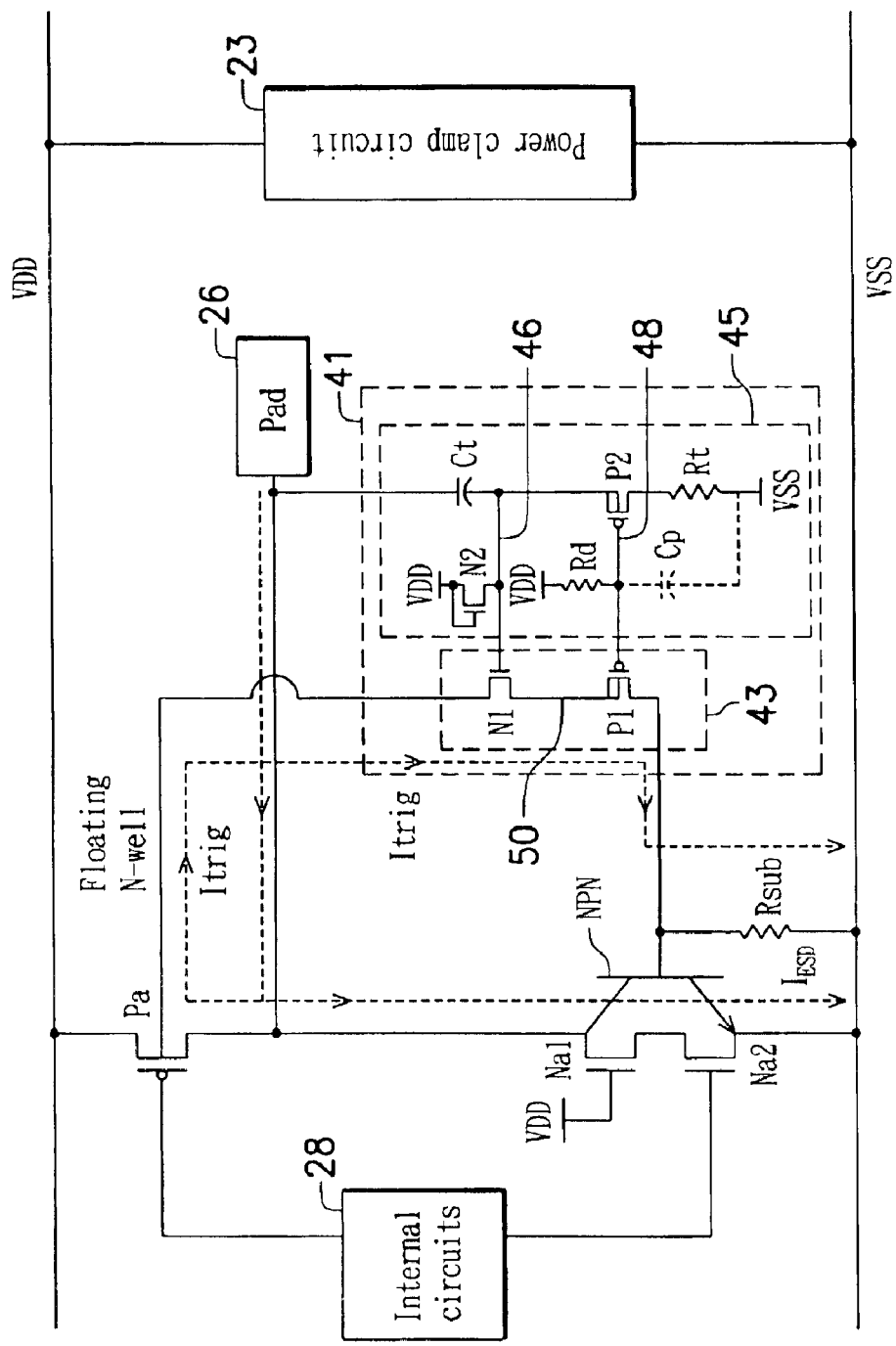

FIG. 12 is a schematic diagram of the third embodiment of the present invention. The triggering current generator 41 coupled between a pad 26 and a power line VSS comprises a current generator 43 and an ESD detector 45. The input end of the current generator 43 (the drain of the NMOS transistor N1) is coupled to the floating N-well of the PMOS transistor Pa. The detecting end of the ESD detector 45 (one end of the capacitor Ct) is directly coupled to the pad 26. The paths of the triggering current $I_{trig}$ and the ESD current $I_{ESD}$ in a PS-mode ESD event are shown in FIG. 12. The operations of the ESD protection circuit in FIG. 12 during normal power operations and other modes of ESD events are similar to those in the first embodiment.

The Fourth Embodiment

Figure 13:
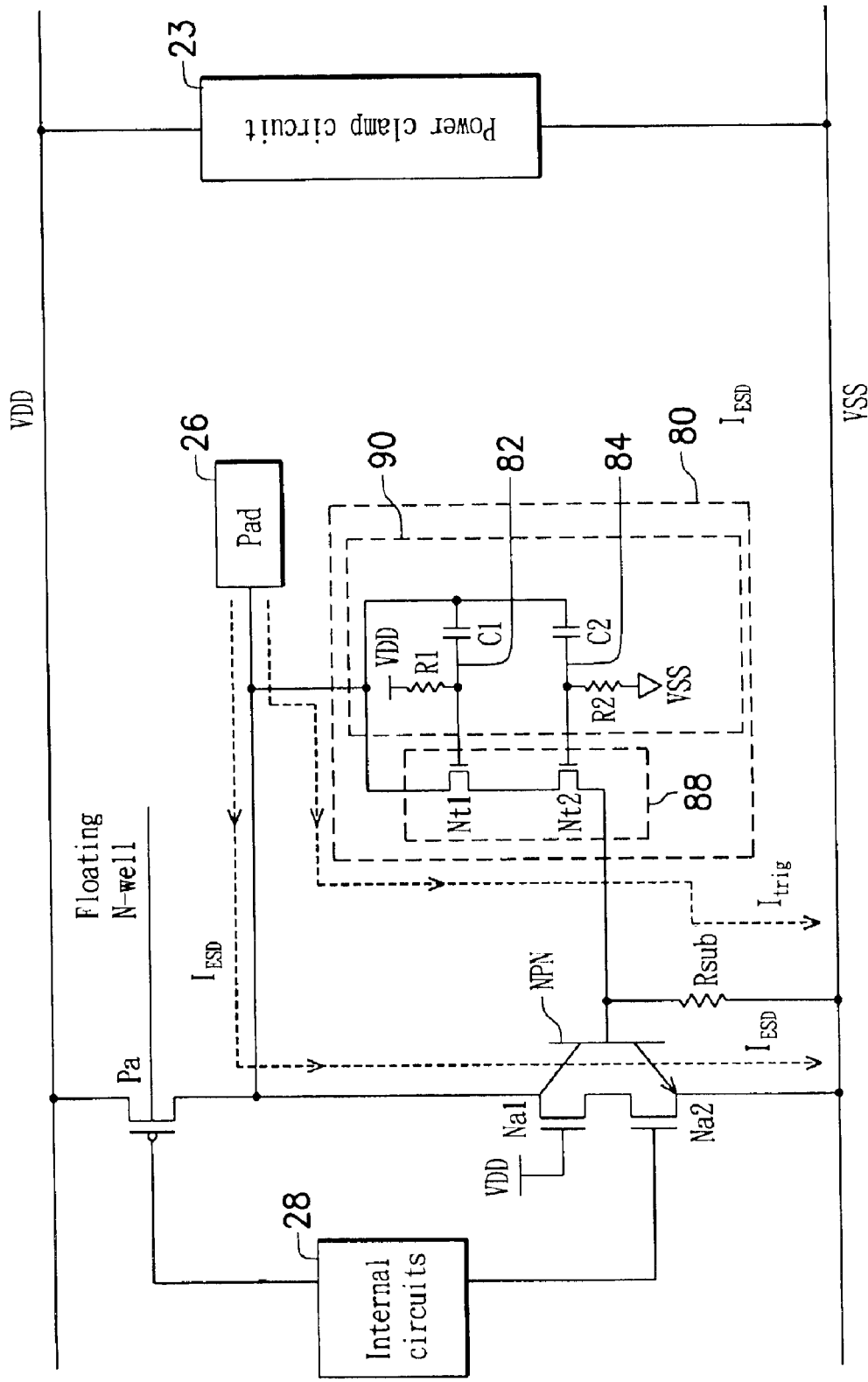

FIG. 13 is a schematic diagram of an ESD protection circuit implemented by another type of triggering current generator. The current generator 88 in the triggering current generator 80 comprises two cascoded NMOS transistors Nt1 and Nt2. The ESD detector 90 comprises two RC coupling circuits. The first RC coupling circuit comprises a resistor R1 and a capacitor C1 coupled between a pad 26 and a power line VDD. The first RC coupling circuit triggers the NMOS transistor Nt1 during an ESD event and couples the gate of the NMOS transistor Nt1 to the power line VDD under normal circuit operations. The second RC coupling circuit comprises a resistor R2 and a capacitor C2 coupled between the pad 26 and a power line VSS. The second RC coupling circuit triggers the NMOS transistor Nt2 during an ESD event and couples the gate of the NMOS transistor Nt2 to the power line VSS under normal circuit operations.

Under Normal Circuit Operations

Under normal circuit operations, the NMOS transistors Nt1 and Nt2 are highly reliable as the stacked Na1 and Na2 in the previous embodiments, and no further descriptions are thus provided herein. Under the presence of the capacitors C1 and C2 and the closed NMOS transistor Nt2, no DC power is consumed by the triggering current generator 80 at normal power operations.

PS-mode ESD Event

Before an ESD event occurs, the whole IC is in a state of equivalent potential. All the nodes (including the power lines VDD, VSS, and the nodes 82 and 84) are coupled to the ground through the power line VSS. Therefore, the NMOS transistors Nt1 and Nt2 in the triggering current generator 41 are closed.

When a positive ESD pulse occurs at the pad 26, the voltage at the node 82 (or 84) increases through the coupling effect of the capacitor C1 (or C2) to trigger the NMOS transistor Nt1 (or Nt2). A small amount of triggering current $I_{trig}$ is sent from the pad 26 to the base of the NPN BJT through the transistors Nt1 and Nt2. When the voltage at the base of the NPN BJT ($=I_{trig} \times R_{sub}$) reaches a predetermined value, the NPN BJT is triggered to bypass the ESD current $I_{ESD}$ and release the ESD stress at the pad 26, as shown in FIG. 13.

Other Modes of ESD Events

In a PD, NS or ND-mode ESD event, it can be deduced by the person in the art that the ESD stress will be released by the ESD protection circuit in FIG. 13. The theories and the paths of the current discharge are similar to those described in the previous embodiments.

The Fifth Embodiment

Figure 14:
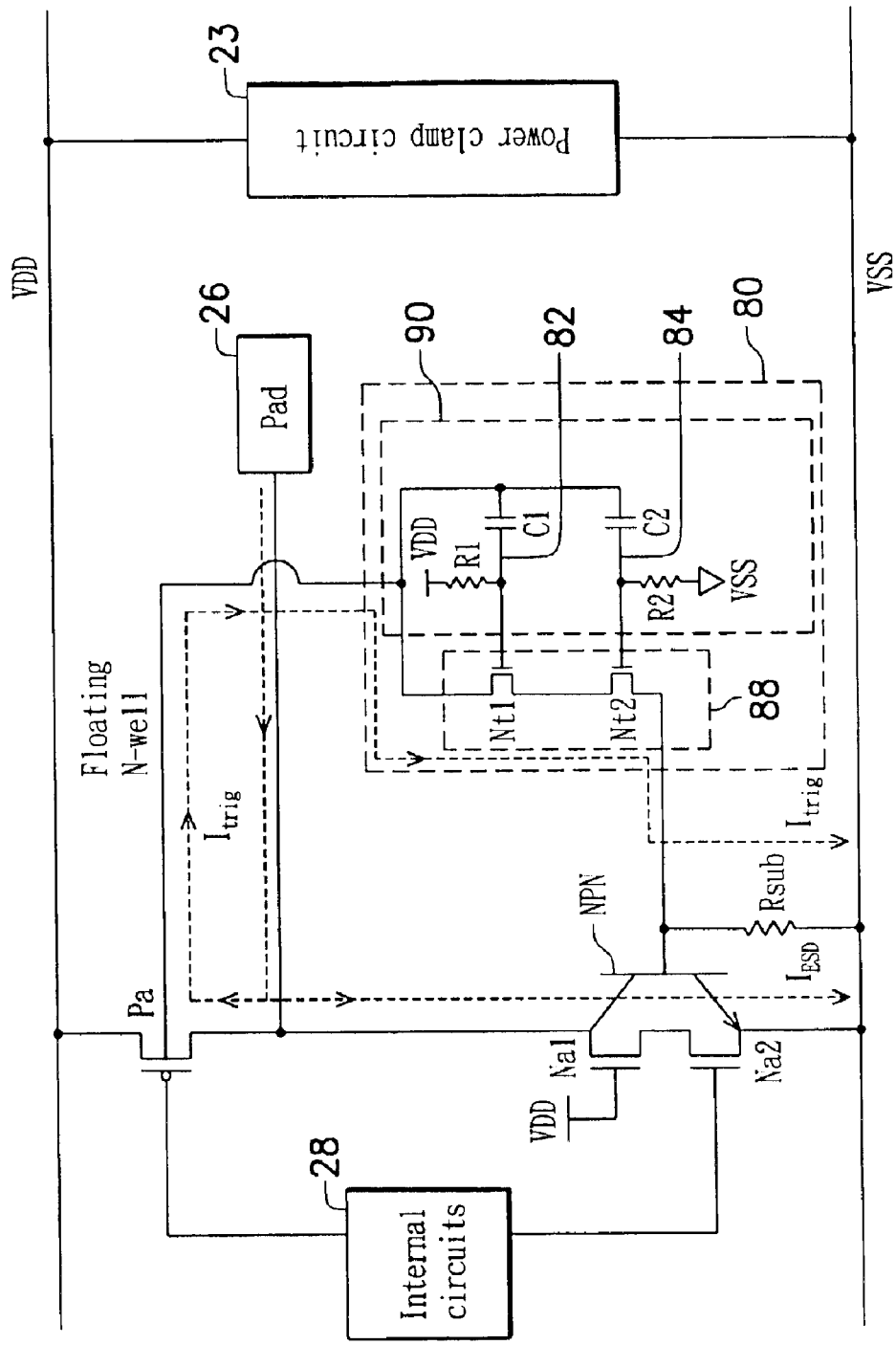

FIG. 14 is a schematic diagram of the fifth embodiment of the present invention. The triggering current generator 80 is coupled between a pad 26 and a power line VSS, comprising a current generator 88 and an ESD detector 90. The input end of the current generator 88 (the drain of the NMOS transistor Nt1) and the detecting end of the ESD detector 90 (where the capacitors C1 and C2 are coupled) are coupled to the floating N-well of the PMOS transistor Pa. The paths of the triggering current $I_{trig}$ and the ESD current $I_{ESD}$ in a PS-mode ESD event are shown in FIG. 14. The operations of the ESD protection circuit in FIG. 14 at normal circuit operations and other modes of ESD events are similar to those described in the fourth embodiment.

The Sixth Embodiment

Figure 15:
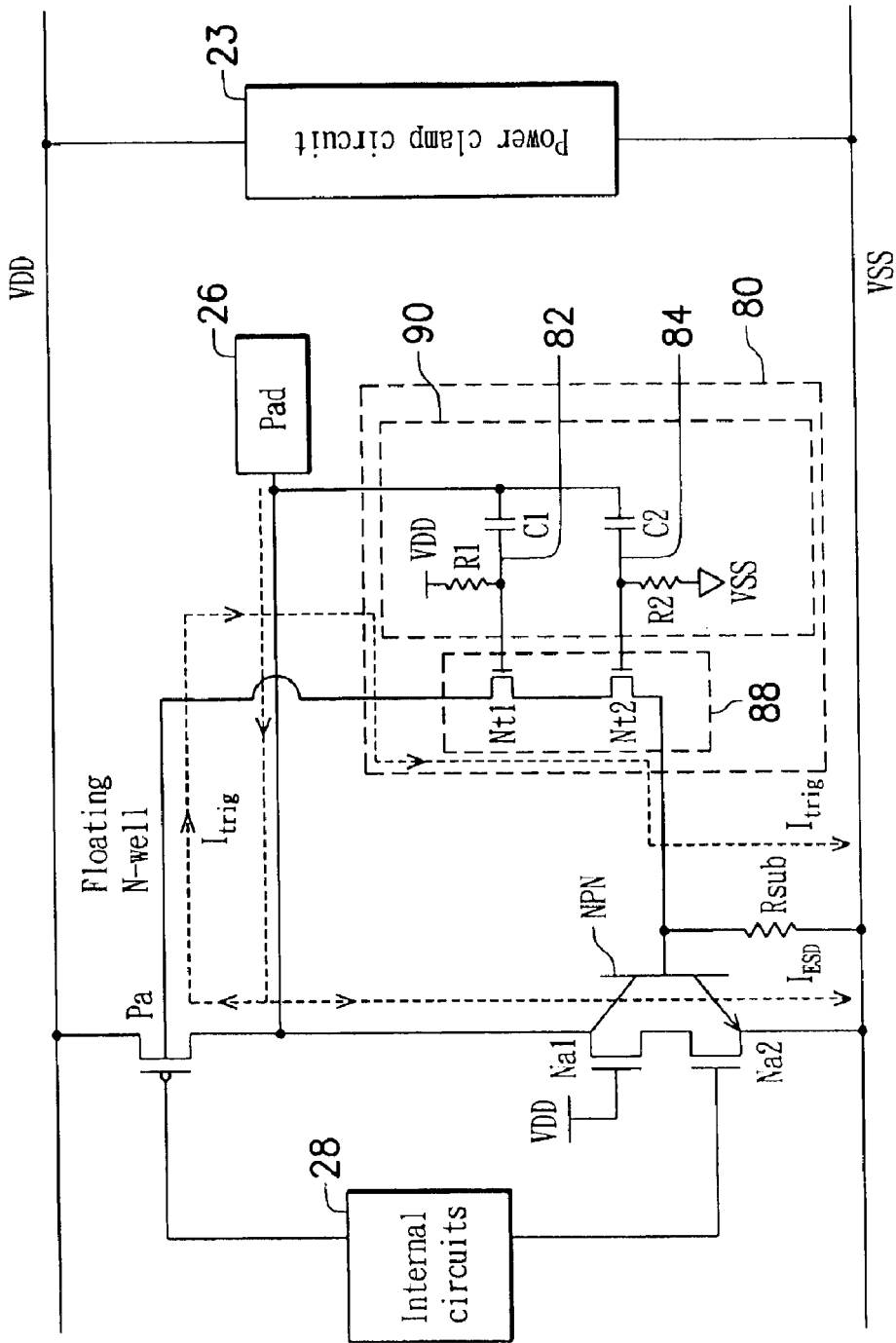

FIG. 15 is a schematic diagram of the sixth embodiment of the present invention. The triggering current generator 80 is coupled between a pad 26 and a power line VSS, comprising a current generator 88 and an ESD detector 90. The input end of the current generator 88 (the drain of the NMOS transistor Nt1) is coupled to the floating N-well of the PMOS transistor Pa; and the detecting end of the ESD detector 90 (where the capacitors C1 and C2 are coupled) is directly coupled to the pad 26. The paths of the triggering current $I_{trig}$ and the ESD current $I_{ESD}$ in a PS-mode ESD event are shown in FIG. 15. The operations of the ESD protection circuit in FIG. 15 at normal circuit operations and other modes of ESD events are similar to those in the fourth embodiment.

Finally, while the invention has been described by way of example and in terms of the preferred embodiment, it is to be understood that the invention is not limited to the disclosed embodiments. On the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. An electrostatic discharge (ESD) protection circuit, suitable for application to a mixed-voltage integrated circuit (IC), comprising:

at least one cascoded transistor pair, each cascoded transistor pair comprising:

a first N-type metal oxide semiconductor (NMOS) transistor, formed on a P-type semiconductor layer, having a gate region, a drain region and a source region, the drain region coupled to a pad of the mixed-voltage IC, and the gate region coupled to a low power supply of the mixed-voltage IC; and a second NMOS transistor, formed on the P-type semiconductor layer, having a gate region, a drain region and a source region, the source region of the second NMOS transistor coupled to a ground plane of the mixed-voltage IC;

wherein the source region of the first NMOS transistor is coupled to the drain region of the second NMOS transistor, and the drain region of the first NMOS transistor, the P-type semiconductor layer and the source region of the second NMOS transistor form the collector, the base and the emitter of a parasitic NPN bipolar junction transistor (BJT); and a triggering current generator, for providing a triggering current to the base, to trigger the NPN BJT and release the ESD current during an ESD event, and, under normal operations, turning off the parasitic NPN;

wherein the triggering current generator comprises:

a current generator, having an input end coupled to the pad during an ESD event and an output end coupled to the base of the parasitic NPN BJT; and an ESD detector, with a detecting end coupled to the pad during an ESD event, for triggering the current generator when an ESD event is detected;

wherein the current generator comprises:

a third NMOS transistor, having a drain as the input end, and a source; and a first PMOS transistor, having a source coupled to the source of the third NMOS transistor, a drain as the output end of the current generator, and a gate.

2. The ESD protection circuit in claim 1, wherein both the detecting end and the input end are directly coupled to the pad.

3. The ESD protection circuit in claim 1, wherein the detecting end is directly coupled to the floating N-well and the input end is directly coupled to the pad.

4. An electrostatic discharge (ESD) protection circuit, suitable for application to a mixed-voltage integrated circuit (IC), comprising:

at least one cascoded transistor pair, each cascoded transistor pair comprising:

a first N-type metal oxide semiconductor (NMOS) transistor, formed on a P-type semiconductor layer, having a gate region, a drain region and a source region, the drain region coupled to a pad of the mixed-voltage IC, and the gate region coupled to a low power supply of the mixed-voltage IC; and a second NMOS transistor, formed on the P-type semiconductor layer, having a gate region, a drain region and a source region, the source region of the second NMOS transistor coupled to a ground plane of the mixed-voltage IC;

wherein the source region of the first NMOS transistor is coupled to the drain region of the second NMOS transistor, and the drain region of the first NMOS transistor, the P-type semiconductor layer and the source region of the second NMOS transistor form the collector, the base and the emitter of a parasitic NPN bipolar junction transistor (BJT); and a triggering current generator, for providing a triggering current to the base, to trigger the NPN BJT and release the ESD current during an ESD event, and, under normal operations, turning off the parasitic NPN;

wherein the triggering current generator comprises:

a current generator, having an input end coupled to the pad during an ESD event and an output end coupled to the base of the parasitic NPN BJT; and an ESD detector, with a detecting end coupled to the pad during an ESD event, for triggering the current generator when an ESD event is detected;

wherein the ESD detector comprises:
- a capacitor, coupled between the pad and the gate of the third NMOS transistor;
- a voltage limiter, coupled and forward biased between the low power supply and the gate of the third NMOS transistor;
- a second PMOS transistor, having a gate coupled to the gate of the first PMOS transistor, a source coupled to the gate of the third NMOS transistor, and a drain;
- a first resistor, coupled between the gate of the first PMOS transistor and the low power supply; and
- a second resistor, coupled between the second PMOS transistor and the ground plane.

5. An electrostatic discharge (ESD) protection circuit, suitable for application to a mixed-voltage integrated circuit (IC), comprising:
- at least one cascoded transistor pair, each cascoded transistor pair comprising:
  - a first N-type metal oxide semiconductor (NMOS) transistor, formed on a P-type semiconductor layer, having a gate region, a drain region and a source region, the drain region coupled to a pad of the mixed-voltage IC, and the gate region coupled to a low power supply of the mixed-voltage IC; and
  - a second NMOS transistor, formed on the P-type semiconductor layer, having a gate region, a drain region and a source region, the source region of the second NMOS transistor coupled to a ground plane of the mixed-voltage IC;

wherein the source region of the first NMOS transistor is coupled to the drain region of the second NMOS transistor, and the drain region of the first NMOS transistor, the P-type semiconductor layer and the source region of the second NMOS transistor form the collector, the base and the emitter of a parasitic NPN bipolar junction transistor (BJT); and a triggering current generator, for providing a triggering current to the base, to trigger the NPN BJT and release the ESD current during an ESD event, and, under normal operations, turning off the parasitic NPN, wherein the triggering current generator comprises:
- a current generator, having an input end coupled to the pad during an ESD event and an output end coupled to the base of the parasitic NPN BJT; and
- an ESD detector, for triggering the current generator when an ESD event is detected;

the current generator comprises a third NMOS transistor and a fourth NMOS transistor stacked between the pad and the ground plane, the ESD detector comprising:
- a first RC coupling circuit, coupled between the pad and the low power supply, having a first triggering end coupled to the gate of the third NMOS transistor; and
- a second RC coupling circuit, coupled between the pad and the ground plane, having a second triggering end coupled to the gate of the fourth NMOS transistor.

* * * * *